(12) United States Patent
Fang et al.

(10) Patent No.: US 9,953,803 B2
(45) Date of Patent: Apr. 24, 2018

(54) LOCAL ALIGNMENT POINT CALIBRATION METHOD IN DIE INSPECTION

(71) Applicant: Hermes Microvision Inc., Hsinchu (TW)

(72) Inventors: Wei Fang, Milpitas, CA (US); Kevin Liu, Fremont, CA (US); Fei Wang, Santa Clara, CA (US); Jack Jau, Los Altos Hills, CA (US)

(73) Assignee: HERMES MICROVISION INC., Hsinchu (TW)

( * ) Notice: Subject to any disclaimer, the term of this patent is extended or adjusted under 35 U.S.C. 154(b) by 128 days.

(21) Appl. No.: 15/049,524

(22) Filed: Feb. 22, 2016

(65) Prior Publication Data
US 2016/0247660 A1    Aug. 25, 2016

Related U.S. Application Data

(60) Provisional application No. 62/120,614, filed on Feb. 25, 2015.

(51) Int. Cl.
*H01J 37/20* (2006.01)
*H01J 37/06* (2006.01)

(52) U.S. Cl.
CPC .............. *H01J 37/20* (2013.01); *H01J 37/06* (2013.01); *H01J 2237/202* (2013.01)

(58) Field of Classification Search
CPC ....... H01J 37/20; H01J 37/06; H01J 2237/202
USPC ................... 250/306, 307, 309, 310, 311
See application file for complete search history.

(56) References Cited

U.S. PATENT DOCUMENTS

| | | | |
|---|---|---|---|
| 2006/0239535 A1* | 10/2006 | Takada | G01N 21/95607 382/145 |
| 2007/0187595 A1* | 8/2007 | Tanaka | G01N 23/2251 250/307 |
| 2013/0203001 A1* | 8/2013 | Wang | G03F 7/2022 430/296 |

\* cited by examiner

*Primary Examiner* — Nicole Ippolito
(74) *Attorney, Agent, or Firm* — Finnegan, Henderson, Farabow, Garrett & Dunner LLP

(57) ABSTRACT

A calibration method for calibrating the position error in the point of interest induced from the stage of the defect inspection tool is achieved by controlling the deflectors directly. The position error in the point of interest is obtained from the design layout database.

24 Claims, 13 Drawing Sheets

LOCAL ALIGNMENT POINT CALIBRATION METHOD IN DIE INSPECTION

CLAIM OF PRIORITY

This application claims the benefit of priority of U.S. provisional application No. 62/120,614 entitled to Fang et al. filed Feb. 25, 2015 and entitled "Local Alignment", the entire disclosures of which are incorporated herein by reference.

BACKGROUND OF THE INVENTION

1. Field of the Invention

The invention relates to a method for aligning a point pattern within a field of view for calibrating stage errors during defect inspection.

2. Description of the Prior Art

Undoubtedly, compared to any other technology or knowledge, semiconductor devices not only impact nowadays society but also influence our daily life. Although it can be traced to two centuries ago, for example Alessandro Volta in 18th century and Michael Faraday in 19th century, the history of semiconductor development indeed influences mankind in commercial semiconductor devices is 20th century. In the first, vacuum tube transistor is replaced by the semiconductor devices which mainly include BJT (Bipolar Junction Transistor) and MOSFET (Metal-Oxide-Semiconductor Field Effect Transistor), and then the semiconductor devices are minimized into integrated circuits. No matter digital logic circuit device, analog circuit device or communication devices, these semiconductor devices can be fabricated on silicon-based substrate or semiconductor compound substrate. Another semiconductor devices are photoelectronic devices which mostly include LED (Light Emitting Diode), LD (LASER Diode) or photovoltaic cell base on photoelectric effect. Currently, digital electronic devices based on MOSFET fabricated in silicon substrate are commercially the most significant, and the applications of the devices are processors and memory devices.

Fabrication processes for manufacturing ICs in the silicon substrate include cleaning process, oxidation and thermal process, ion-implementation process, thin film deposition, lithography, etching process and CMP (Chemical Mechanical Polishing) process. By the combination of the above processes, when all electronic devices are formed in the substrate, and then followed by metallization process to electric connect all electronic devices, a specific application device, such as CPU, ASIC, FPGA, DRAM, or Flash, can be produced. With the technology progress of semiconductor process, the smaller width of an electronic device followed by Moore's law which means transistors are doubled every 24 months, the more devices in one wafer can be fabricated to cost down.

The semiconductor fabrication processes include ion implantation process, thermal process, thin film deposition process, etching process, CMP (Chemical Mechanical Polishing) process, lithography, and cleaning process. And they will be briefed hereinafter.

Ion-implantation process will direct group III or group V atoms implanted into silicon substrate to alter local electric conductivity such that some regions are positive conductivity and some regions are negative conductivity. Phosphorus or Arsenic atoms are usually used for the negative conductivity, while Boron atom is usually used for the positive conductivity.

Thermal process provides formation of thermal oxide layer and annealing for drive-in after ion-implantation. In the present art, RTP (Rapid Thermal Process) is popular instead of conventional thermal process in furnace. It includes RTO (Rapid Thermal Oxidation) and RTA (Rapid Thermal Annealing) to respectively form silicon oxide and repair lattice damages after ion-implantation such that single crystal structure can be recovered and dopant can be activated.

Thin film deposition process includes PVD (Physical Vapor phase Deposition) and CVD (Chemical Vapor phase Deposition) to form several to several tens thin film layers with variant materials and thicknesses on silicon substrate. Metal layers, formed on a substrate, always provide electric interconnections among devices, while dielectric layer provides isolation between metal layers. Chemical reactions in vapor phase, happened to form thin films in CVD, include MOCVD (Metal-Organic CVD), APCVD (Atmosphere Pressure CVD), LPCVD (Low Pressure CVD), HPCVD (Hybrid Physical CVD), RTCVD (Rapid Thermal CVD), HDPCVD (High Density Plasma CVD), and PECVD (Plasma Enhanced CVD). Thin films forms by CVD usually include silicon oxide, silicon nitride, polysilicon, metal tungsten, metal aluminum, and metal titanium nitride. Metal target are heated or bombarded in vacuum such that atoms on the metal target can be transferred to substrate surface to form thin film in PVD, which includes evaporation and sputtering. Metal thin films, such as aluminum, titanium, or alloy thereof, are always formed by using PVD. Quality control of the thin film is critical to IC process, so thin film process must be monitored throughout the procedure to reflect abnormal, such that thickness uniformity and defect and be avoided.

Etching process, which includes wet etch and dry etch, is to remove material. In the semiconductor process, patterns on a reticle can be transferred to a thin film by using etch process. Wet etching is isotropic by reacting etchant to selective material, and etched profile always reveals bowl-like shape. Dry etch is popular and anisotropic by reacting plasma in an external electric field with the selective material, and etched profile will reveal vertical-like shape.

CMP is another method to remove material, which introduce slurry between polish pad and wafer with chemical and mechanical reactions to achieve whole wafer planation, such that thin films in the following process can be formed better. Silicon oxide layer, metal layer and polysilicon layer are most applied in the CMP process.

Lithography process, also named photo-lithography process, is the most critical in the semiconductor process, which includes PR (photo Resist) layer coating, soft bake, exposure, development, hard bake, and ash after etching process. The PR can be selectively removed through exposure and development, and circuit patterns can be transferred to a specific material. When the semiconductor process continues shrinking, available RET (Resolution Enhancement technology), such as OPC (Optical Proximity Correction), immersion lithography, and EUV (Extreme Ultraviolet lithography, are applied.

Cleaning process must be processed after all other process recited above to avoid uninvited particles or residues to impact device quality, which includes rinsing wafer by DI (De-Ionized) water and drying the wafer. Ultrasonic agitation can be applied in the cleaning process. This process will clean out all pollutions, such as particles, organic matter, inorganic matter, metal ions.

Defects are inevitably generated in the semiconductor process, which will greatly impact device performance, even failure. Device yield is thus impacted and cost is raised. Current defects can be classified into systematic defects and random defects in general. On the one hand, system defects infer defects will be found repeatedly and systematically in wafers, in which defect patterns can be used as reference in classification to determine root cause of which process incurs such defects. In order to increase semiconductor process yield, it is critical to enhance yield by monitoring, such as by using SEM (Scanning Electron Microscope), systematic defects highly appeared regions in mass production process to real time eliminate systematic defects. On the other hand, the non-systematic defects, random particle defects, are random residues left in wafers. Distributions and characteristic profiles are important references to distinguish systematic defects from non-systematic defects.

More specifically, systematic defects can be classified as reticle errors in alignment or machine offset, process mistakes incurred by recipes or materials, prober damages in wafer probing, scratches on wafer surface, and wafer edge effect of topography incurred from non-uniformity of PR coating or thermal stress.

The corresponding defects are recited hereinafter in brief. Defects incurred in lithographic process include PR residue defects due to PR deteriorated or impurity, peeling defects, bridge defects, bubble defects, and dummy pattern missing defects due to pattern shift. Defects incurred in etching process include etching residue defects, over-etching defects and open circuit defect. Defects incurred in CMP process include slurry residue defects, dishing defects and erosion defects due to variant polishing rates, scratched due to polishing. Further, when process nodes continue shrinking, new materials and processes will be introduced to inevitably incur new type defects. For example, because physical dimension of patterns are smaller than the optical resolution of the applied lithographic wavelength (193 nm), the critical dimension exposed on wafers may incur offset. Thinning defects are another inevitably incurred in the process node shrinking. In order to reduce RC delay in multi-layered interconnection structures, low-k dielectric layer and cupper material are introduced. Cupper can't be etched and hence damascene process is introduced that metal is filled into dielectric layer. Therefore, some other hidden defects are covered under layer, such as void defects, etching residue defects, over-etching defect, under layer particles, and via open incurred in the interconnection process. Such hidden, crucial defects are too hard to be analyzed and eliminated.

For the non-systematic defects are mainly random particles defect incurred from particles in air randomly fallen on the wafer, which are not easy to be identified and resolved.

In order to enhance semiconductor process yield, defects have to be identified as soon as possible to prevent from impact pouring out. Optical microscope is used in conventional optical inspection which includes bright field inspection and dark field inspection. Every die on a wafer is scanned by optical beam and images of every die are generated and stored. A die-to-die compare is used to identify if there is any abnormal or defect with locations and images thereof.

When semiconductor nodes continue shrinking, dimensions of defect shrink also. Unimportant small defects in previous now become critical therefore. It is a challenge to identify such small defects by using conventional optical inspection tool and a new tool is necessary. One method is to combine the operations of optical inspection and review SEM. Because of resolution, the optical inspection is not enough to meet requirement of identifying defects, but a suspect region in blurred images can be determined defectlike and reviewed by review SEM with high resolution. Thus defects can be identified and analyzed. Another method is to illuminate dual beams on a wafer surface to obtain interference patterns, and defect regions always have different interference pattern to that of the normal region. Thus, defects can be identified and further analyzed by review SEM. In practice, defects must be identified first and locations of the defects are forward to review SEM with high resolution to analyze defects.

However, in sub-20 nanometer semiconductor node, optical inspection tool can't reveal any pattern more, even by using interference method, and hence SEM is the only way to identify defects. Nevertheless, due to the detected signal electrons in the SEM are secondary electrons, detection duration inevitably retrogrades significantly compared to that of optical inspection. Hence, it is an important issue to fast identify defects on a wafer by using SEM. An ebeam inspection tool, based on SEM, is currently best solution for defect inspection.

The ebeam inspection tool is to find or identify defects in the semiconductor process, and relative to review SEM, a large FOV (Field-of-View) and large beam current are commercial means to enhance inspection throughput. In order to obtain large FOV, a SORIL (Swing Objective Retarding Immersion Lens) system is applied commercially. Moreover, resolution is sometimes lowered, compared to review SEM, enough to capture defects.

The ebeam inspection tool is designed different from the review SEM. The review SEM is designed to known, identified defects or suspects of defect, so scan duration is long enough to analyze or review defects, and hence it can't process inspection. On the other hand, the ebeam inspection tool, with high scanning rate than the review SEM and high resolution than the optical inspection tool, can identify defects that the optical inspection tool in no way to capture.

Furthermore, in lithographic process, some particular patterns may have great possibility to incur defects, but won't incur them each time. The defects generated by these particular patterns even can't be modified through recipe tuning or modifying reticle directly. Such a kind of patterns is named hot spot, and must be monitored in-line process.

Applications of SEM, except yield management tool of ebeam inspection and analysis tool of review SEM, may further be metrology tool in semiconductor manufacturing process; that is CD (critical Dimension)-SEM. CD-SEM will measure CD in a wafer with by line-scanning sample with moving stage to reveal process uniformity. Moreover, in order to obtain exact dimension, resolution is very critical, and thus low beam current must be applied.

Still another application of SEM is EBDW (E-Beam Direct Writer), or named EPL (E-beam Projection Lithography), still based on SEM. Purposes of EBDW are to expose a photoresist directly, and an etching step can be applied to transfer patterns to a sample after the photoresist is developed. In such a process, there is no reticle necessary, and patterns are written directly on the sample. Because wavelength of an ebeam is superior small than an optical wavelength, finer patterns, such as nano scale resolution, can be easily obtained.

About the defect inspection tool, one of the important factors, impacting the yield rate of the semiconductor processing, is the inspecting accuracy. Currently, the inspection resolution is about 10 nanometers or less than 10 nanometers. However, the factors impacting the inspecting results are not only the inspecting resolution, but the accuracy of movement of the stage which carries the wafer.

The stage of the defect inspection tool is driven by configuring a linear motor to the stage and several bearings placed beneath the stage. However, since the friction will be induced between the bearings and the stage during the stage movement, the accuracy of the linear motor is limited, even if the linear motor has high accuracy.

More specifically, the accuracy of the stage movement is approximately 0.8 micrometers to 1.2 micrometers, and the inspection resolution is about 10 nanometers or less than 10 nanometers. Therefore, the accuracy of the stage movement and the inspection resolution have obviously different orders. Thus, if the stage movement has small error, the inspecting results are still impacted. Hence, the error of the stage movement must be corrected before inspecting the defects.

SUMMARY OF THE INVENTION

This invention relates to a method for calibrating the stage movement error of the ebeam inspection tool, which is achieved by utilizing deflectors to compensate the stage movement error within a field of view with hundreds of micrometers and a point of interest with sub-micrometers inside the field of view. Accordingly, the calibration time is significantly reduced and the throughput is increased as well.

One aspect of the invention includes an alignment method within a first point of interest in a field of view, which comprises steps of identifying a pattern inside the first point of interest scanned by a charged particle beam tool, and comparing a location of the pattern in the first point of interest to a design layout database corresponding to the pattern to obtain an offset induced from the charged particle beam tool.

Another aspect of the invention includes a method for calibrating a stage moving error in die inspection by using a charged particle beam tool, which comprises steps of aligning a first field of view scanned by the charged particle beam tool to a design layout database prior to a first point of interest in the first field of view being inspected, such that a first field of view base position error of the charged particle beam tool is obtained, aligning the first point of interest in the first field of view scanned by the charged particle beam tool to the design layout database prior to the first point of interest being inspected, such that a first point of interest base position error of the charged particle tool is obtained, and aligning a second point of interest scanned by the charged particle beam tool to the design layout database prior to the second point of interest being inspected if the second point of interest is not close to the first point of interest, such that a second point of interest base position error of the charged particle beam tool is obtained.

Still another aspect of the present invention includes a method for calibrating a stage movement error when a wafer is inspected by using a charged particle beam tool, which comprises steps of processing a die base calibration procedure to a specific die on the wafer, such that a die base error is offset, processing a first field of view base alignment procedure to a first field of view on the specific die, such that a first field of view base error is calculated and applied to a stage of the charged particle beam tool, processing a first point of interest base alignment procedure to a first point of interest in the first field of view, such that a first point of interest base error is calculated and applied to a deflector of the charged particle beam tool, inspecting the first point of interest, inspecting a second point of interest close to the first point of interest with the first point of interest base error applied to the deflector of the charged particle beam tool, processing a second point of interest base alignment procedure to a third point of interest not near to the first point of interest, such that a second point of interest base error is calculated and applied to the deflector of the charged particle beam tool, inspecting the third point of interest, and processing a second field of view base alignment procedure to a second field of view on the specific die when the second field of view is far away from the first field of view, such that a second field of view base error is calculated and applied to the stage of the charged particle beam tool.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF EXAMPLE EMBODIMENTS

Figure 1:
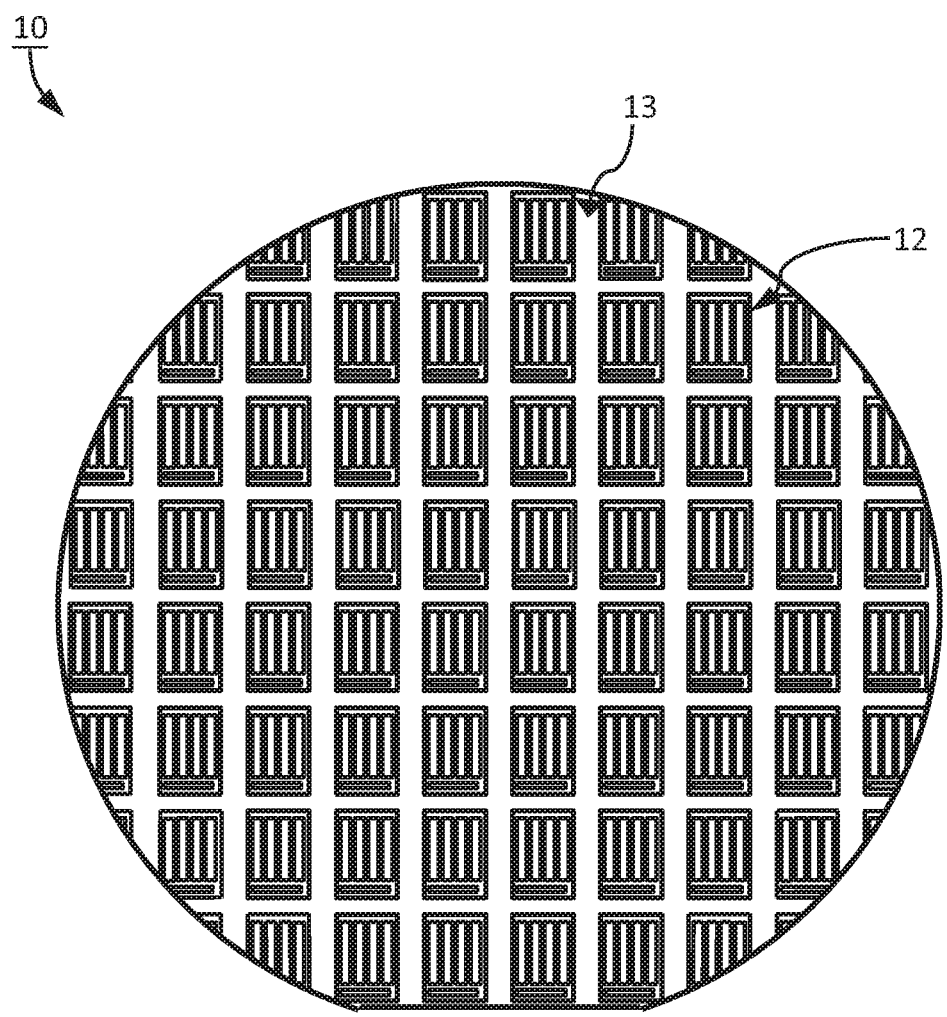
FIG. 1 shows a diagram of a wafer comprising several dice.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

Regarding to the present defect inspection tool, which can be a charged particle beam inspection tool, such as review SEM, CD SEM, or ebeam inspection tool, the significant error of the stage movement still exist due to the different orders between the accuracy and the inspection resolution, even if the wafer level calibration of the stage has been finished. Thus, the calibration of the stage before inspecting defects is essential.

For a CD SEM, since only few dice will be scanned, the position error of the stage will not severely impact the throughput. For a review SEM, parts of the dice are scanned or analyzed, so the throughput is not influenced seriously as well. Accordingly, the repeated calibration procedures can be suffered in the CD SEM or the review SEM.

In contrast, the positions of the defects cannot be predicted by the ebeam inspection tool due to they're unknown before inspection, and therefore the repeated calibration procedures in the ebeam inspection tool are inevitable for the accuracy and correctness. In this way, the throughput must be reduced significantly, and the long-term errors of the stage position are still accumulated.

In the present invention, a field of view (FOV) of the ebeam inspection tool has the dimension of 100 to 300 micrometers.

In the present invention, a large FOV means the dimension of the ebeam inspection tool is ten times larger than that of the conventional CD SEM or the review SEM.

In the present invention, a point of interest has the dimension of sub-micrometers.

In the present invention, said "near" means that a distance is between two points inside a FOV or several FOVs without calibration.

In the present invention, "local alignment" means that the calibration is processed in a point of interest within the FOV.

In the present invention, said "far" means that a distance between two FOVs is larger than a predetermined threshold value, such that another stage calibration has to be processed.

Figure 2:
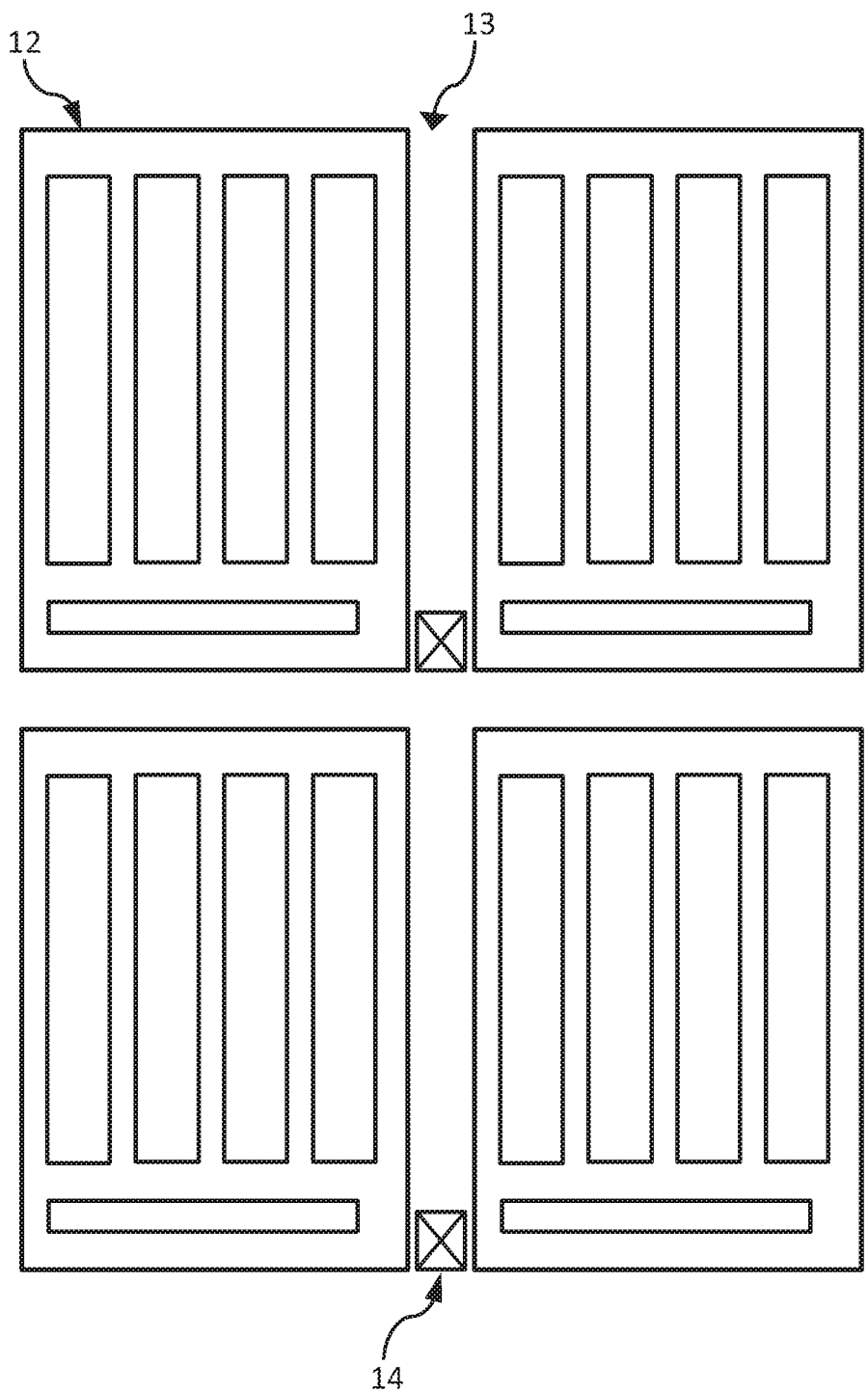
FIG. 2 shows a diagram of four dice in the wafer.

First, please refer to FIG. 1 and FIG. 2. The FIG. 1 shows a diagram of a wafer comprising several dice, and the FIG. 2 shows a diagram of four dice on the wafer.

As shown in FIG. 1, several dice 12 on the wafer 10, and a scribe line 13 is formed between every two dice 12. When a back-end process of the dice 12 is finished, the dice 12 need to be cut along the scribe line 13. In order to test the electricity of each die 12, a test circuit is fabricated in each scribe line 13, which can be electrically contacted by a four-point probe method to determine whether the electricity of the die is normal or not. Furthermore, the FIG. 2 shows the enlarged diagram of the dice 12 on the wafer 10, which has patterns. An alignment mark 14 is located in the scribe line 13 and is near to one corner of each die 12, which is applied to calibrate a stage position of a semiconductor processing tool or a defect inspection tool.

Figure 3:
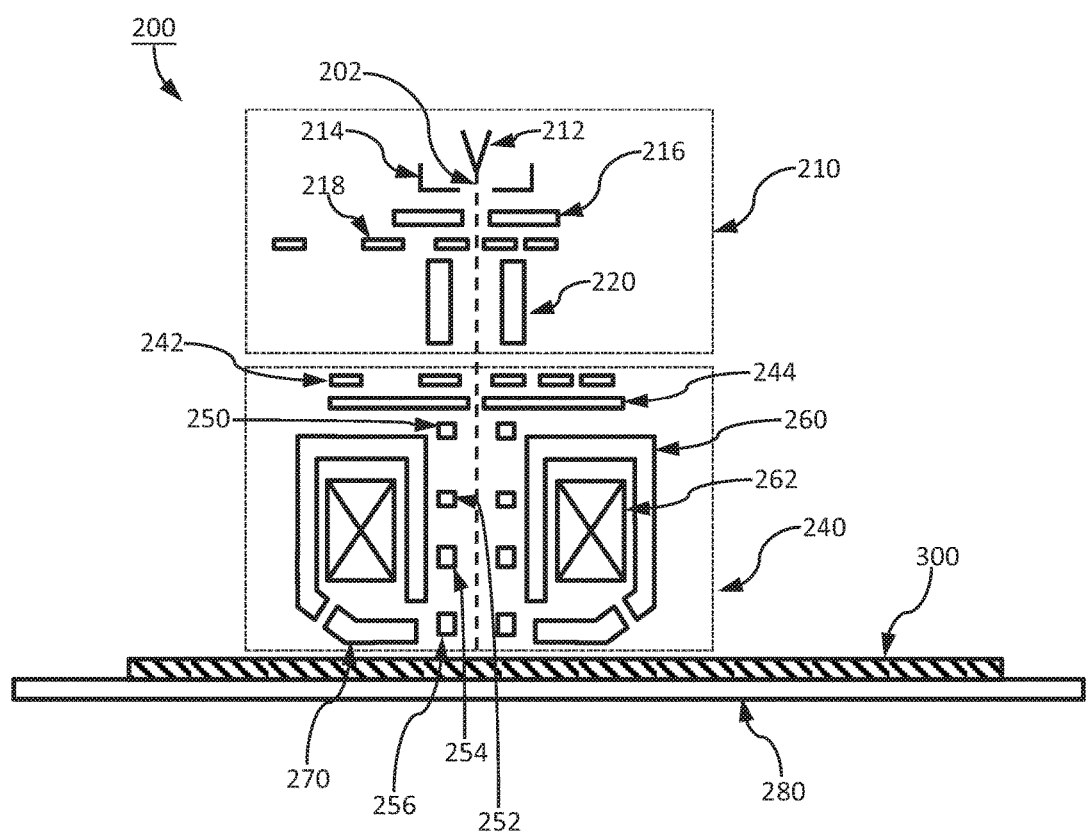
FIG. 3 illustrates a diagram of an ebeam inspection tool.
Figure 4:
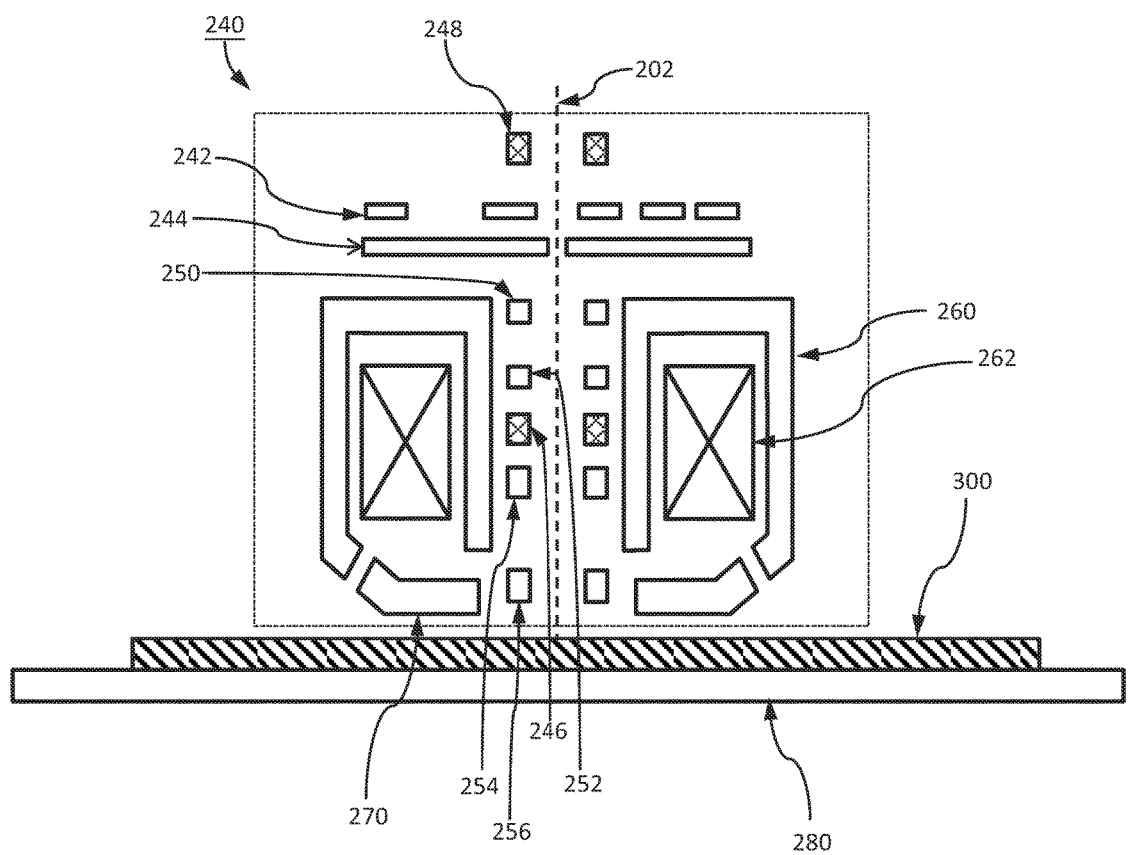
FIG. 4 illustrates the SORIL system of the ebeam inspection tool.

Please refer to the FIG. 3 and the FIG. 4. The FIG. 3 shows a diagram of an ebeam inspection tool, and the FIG. 4 shows a diagram of a swing objective retarding immersion lens (SORIL) system of the ebeam inspection tool.

As shown in the FIG. 3, the ebeam inspection tool 200 comprises an electron gun 210 and a SORIL system 240. The electron gun 210 comprises an electron source 212, suppressor 214, an anode 216, a set of apertures 218, and a condenser 220. The electron source 212 can be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a ZrO2 is coated on the surface of the tungsten pin, and is heated to 1300° C. so as to be melted and cover the tungsten pin but uncover the pinpoint of the tungsten pin. The melted ZrO2 can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced.

By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 3 is an electrostatic lens which can condense the electron beam 202. On the other hand, the condenser 220 can be also a magnetic lens.

The FIG. 4 illustrates the SORIL system 240 which comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 5:
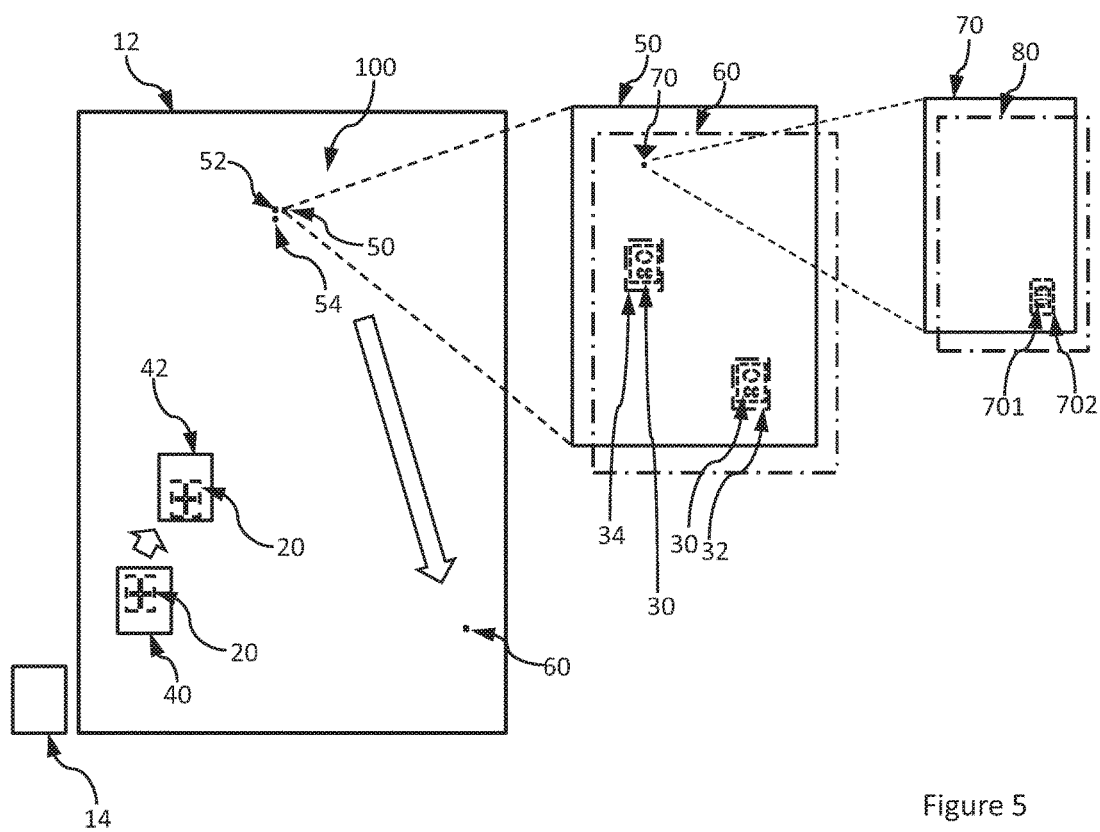
FIG. 5 illustrates the diagram of the dimensions of the die, the field of view insides the die, and the point of interest 70 insides the field of view.

The FIG. 5 illustrates the diagram of the dimensions of the die, the field of view insides the die, and the point of interest 70 insides the field of view.

The die comprises several fields of view 50, 52, 54, and each field of view comprises several points of interest 70. The die base calibration method can be classified into three types. The first die base calibration method is to identify the position of an alignment mark 14 located in the scribe line 13 adjacent to the die 12, and to calibrate the stage position according to the position of the alignment mark.

The second type of the die base calibration method is to identify a specific pattern 20 in the die 12, to image two images 40 and 42 with different positions inside the die 12 by using the specific pattern 20, to calculate the distance between two images 40 and 42, to compare the distance with the design layout pattern to obtain a die base position offset of the stage, and to calibrate the stage error according to the die base position offset of the stage 280.

Another die base calibration method is to identify the specific pattern 20 inside the die, to image an image 40 or 42 according to the specific pattern 20, to compare the position of the specific pattern 20 in the image 40 or 42 to the design layout database to obtain an die base position offset of the stage 280, and to calibrate the stage error according to the die base position offset of the stage 280.

The design layout database, for example, can be the graphic database system (GDS) or the open artwork system interchange standard (OASIS), which shows the circuit layout.

The GDS or OASIS is a data format, which presents different types of the integrated circuit. The difference between the GDS and the OASIS is that the GDS can show 32 bits of the integer coordinates and the OASIS can show the variable integer coordinates which can intend to 64 bits.

In the FIG. 5, the field of view 60 is the correct one if there's no stage position error. However, the stage error inevitably exists during the stage movement, so the shifted field of view 50 is scanned and the field of view base alignment needs to be processed after the die base calibration is finished. About the field of view base alignment, there're two types of methods. One type of field of view base alignment method is to identify a pattern 30 inside the field of view 50, to image two images 32 and 34 with different positions according to the pattern 30 in the field of view 50, to calculate the distance between two patterns 30 insides the two images 32 and 34, to compare the distance to the design layout database, and to obtain a field of view base position offset of the stage 280.

The other type of the field of view base alignment method is to identify the position of the pattern 30 inside the field of view 32 or 34, to compare the position of the pattern 30 to the design layout database, and to obtain the field of view base position offset of the stage 280.

Figure 6:
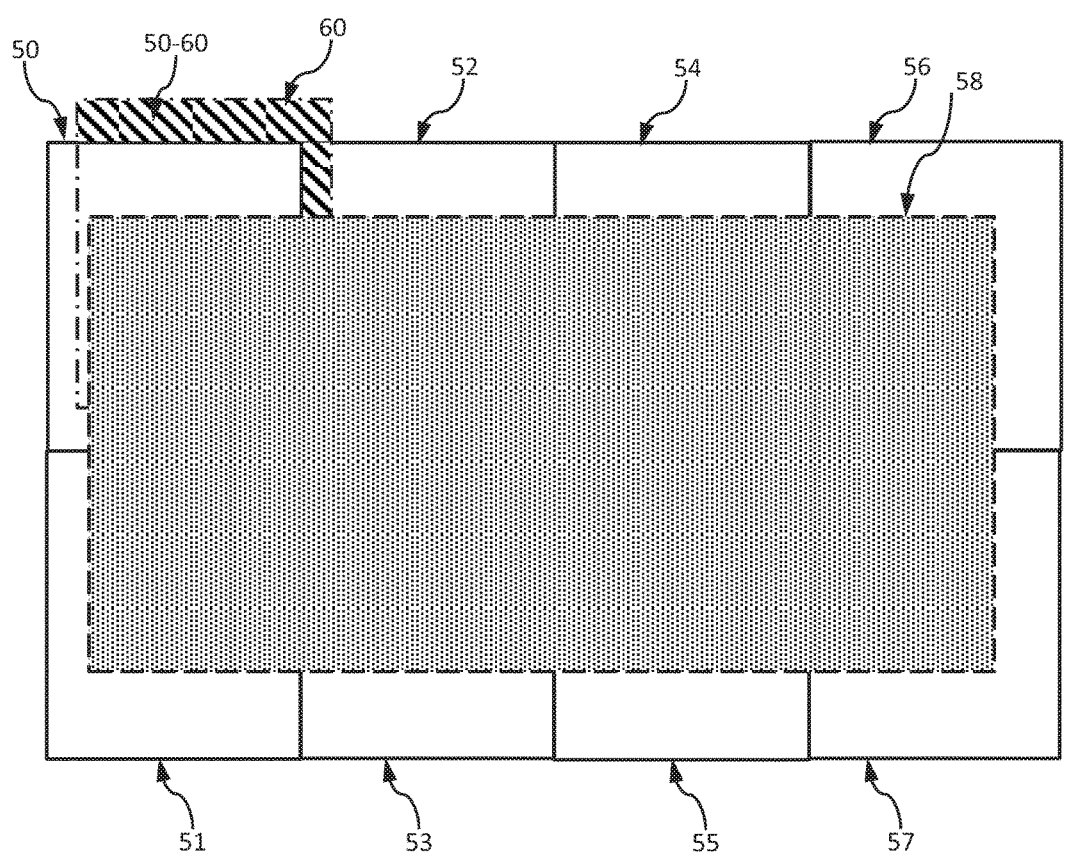
FIG. 6 shows the diagram of the care area defined by users.

Please refer to the FIG. 6, which shows the diagram of the care area 58 defined by users. When the field of view base alignment is finished, users determine whether the field of view base offset has to be calibrated or not based on the first field of view 50 within the care area 58. If the first field of view 50 is out of the care area 58, the field of view base offset of the stage position should be corrected.

In order to obtain more precise position of the stage, a point of interest base alignment is further processed after the field of view base alignment is finished. As FIG. 5 shows, the point of interest 80 is correct if there's no position error of the stage. Actually, there's still a position error of the stage during the stage movement, and the real point of interest 70 is scanned by users, so the point of interest base alignment needs to be processed. The point of interest base alignment method is to identify a pattern 701 in the point of interest, to image an image 701 according to the pattern 701, and to compare the position of the pattern 701 to the design layout database to obtain a point of interest base position offset of the stage 280. The dimension of the field of view is hundreds of micrometers, but the dimension of one point of interest inside the field of view is only sub-micrometers, and thus the point of interest in the field of view can be regarded as a point. Since the dimension of the point of interest is too tiny to calibrate the point of interest base position error of the stage by controlling the stage 280, the deflectors 250, 252, 254, and 256 are used to calibrate the point of interest base position error of the stage 280 in the invention. The response time of the deflectors is shorter than that of the stage 280, so the calibration time is significantly shortened. If the deflector is electrostatic type, the deflection is to control the voltage applied to the electrostatic deflector. On the other hand, if the deflector is magnetic type, the deflection is to control the current applied to the magnetic deflector. The deflectors can refer to the deflectors 250, 252, 254, and 256 in the FIG. 3 and FIG. 4.

Moreover, another method for calibrating the stage error is described as follow, which includes the steps of sequentially processing die base calibration, field of view base calibration, and point of interest base calibration. If the whole process is finished, the calibration is completed. However, if the whole process is not finished, another point of interest is determined whether the distance between it and the original point of interest is larger than a first threshold value or not. If the distance between another point of interest and the original point of interest is not larger than the first threshold value, the point of interest is inspected without processing the local alignment. But, if the distance between the another point of interest and the original point of interest is larger than the first threshold value, that another point of interest is further determined whether or not the distance between the field of view having that another point of interest and the original field of view is larger than a second threshold value defined by users. The field of view base alignment is processed again if the distance between the field of view comprising that another point of interest and the original field of view is larger than the second threshold value. On the contrary, the point of interest base alignment is processed again if the distance between the field of view comprising the uninspected point of interest and the first field of view is not larger than the second threshold and larger than the first threshold value.

Figure 7:
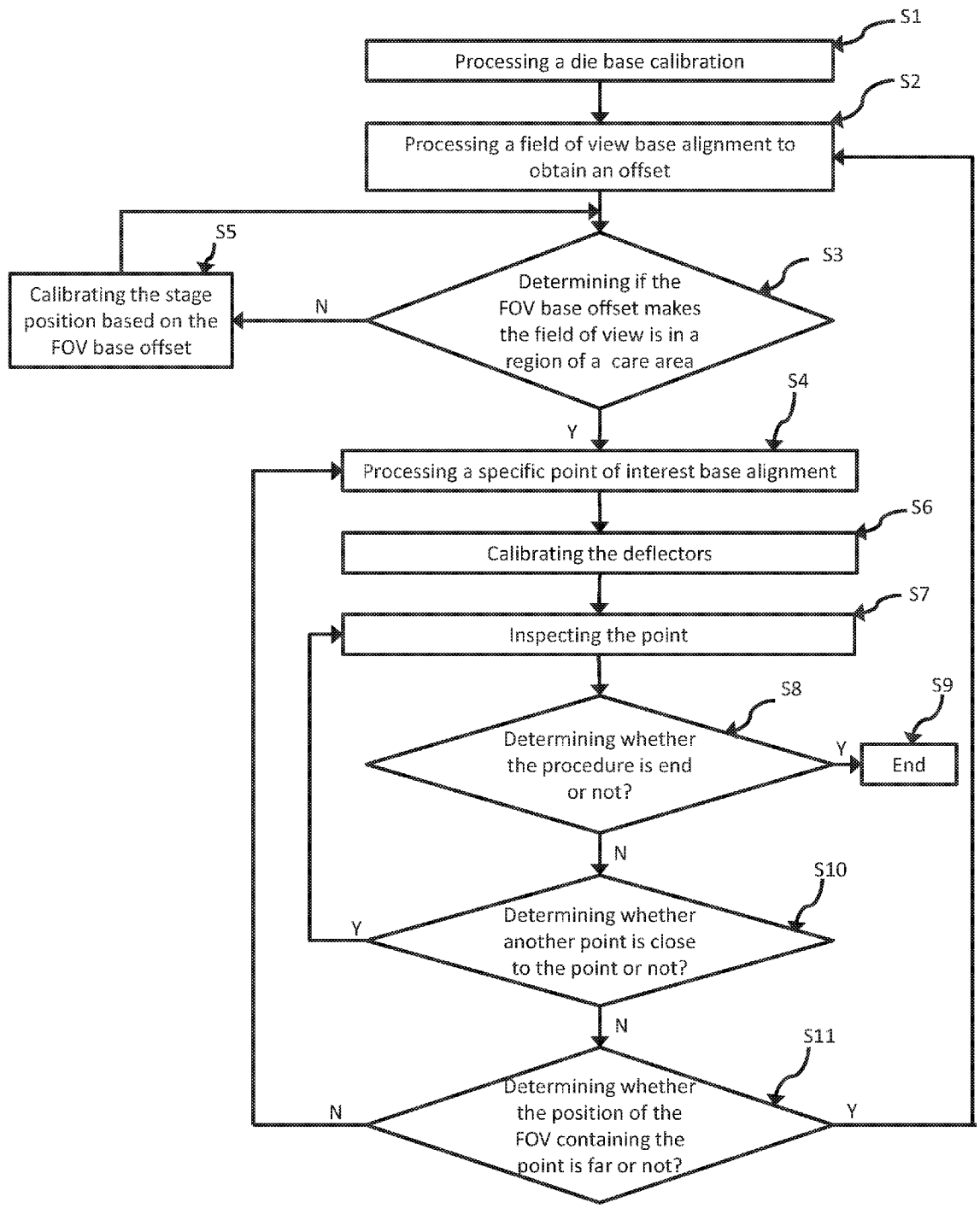
FIG. 7 illustrates the flowchart of the calibration of one embodiment of the present invention.

The FIG. 7 illustrates the flowchart of the calibration of the present invention. First, the step S1 is processed, which is the die base calibration for calibrating the die base position offset of the stage. The die base calibration includes the die base alignment and the die base correction, and the die base alignment can be referred above.

Then, the step S2 is processed, which is field of view base alignment of the stage for obtaining the field of view base position offset of the stage. Since the dimension of the field of view with hundreds micrometers is much smaller than that of the die, which is two centimeters, the stage position can be calibrated more precisely by the field of view base alignment. The detailed field of view base alignment will be described later. In step S3, the field of view base position offset of the stage is determined whether it is calibrated or not according to that the field of view base position offset of the stage is in the care area or not. More specifically, if the field of view base position offset of the stage does not make the field of view out of the care area, the step S4 is processed, which means that the point of interest base alignment can be processed without correcting the field of view base position offset of the stage. On the contrary, if the field of view base position offset make the field of view out of the care area, then the step S5 is processed, which implies a step of calibrating the field of view base position offset of the stage. And the step S3 is processed again after the step S5 is finished till the field of view base position offset make the field of view within the care area.

The step S4 mentioned above is to obtain the point of interest base position offset of the stage. The point of interest base alignment is to capture one image inside the field of view according to a pattern, and to compare the position of pattern in the image to the design layout database to acquire the point of interest base position offset of the stage. The detailed point of interest base alignment will be described later in the FIG. 13.

Next, the step S6 is processed, which calibrates the point of interest base position offset of the stage by controlling the deflection angle and/or the deflection direction of the deflectors due to the point of interest base position offset of the stage is much smaller than the position accuracy of stage. After the step S6 is finished, the step S7 is processed, which means that the point of interest is inspected.

When the step S7 is finished, the step S8 is processed. The step S8 is to determine whether the flow is end or not. If the flow is finished, the calibration procedure is finished which is shown in the step S9. If the flow is not finished, the step S10 is processed, which means that another point of interest is determined whether the distance between it and the previous point of interest is larger than a first threshold value or not. If the distance between that another point of interest and the previous point of interest is not larger than the first threshold value, the step S7 is processed again. On the contrary, if the distance between that another point of interest and the previous point of interest is larger than the first threshold value, then the step S11 is processed, which means the distance between the field of view having that another point of interest and the first field of view is determined whether it is larger than the second threshold or not. When the distance between the field of view comprising that another point of interest and the first field of view is larger than the second threshold, the steps S2~S8 is processed again till the whole flow is finished. On the contrary, when the distance between the field of view comprising that another point of interest and the previous point of interest is not larger than the second threshold and larger than the first threshold value, then steps S4~S8 are processed again till the whole flow is finished.

The definition of "near", regarding as the distance between two points of interest is smaller than the first threshold value and depending on the accuracy of the stage, is decided by users. The first threshold, for example, can be about the length of 10 to 20 dimensions of the field of views, which is not limited in the present invention. The definition of "far", in a preferred embodiment, can be regarded as the distance between the field of view having that another point of interest and the first field of view is larger than the second threshold value. The second threshold value, for example, can be about the length of the dimensions of 100 fields of view. When the distance between two fields of view is far, the field of view base calibration should be processed again. Moreover, if two points of interest are near, the two points of interest may be located in the same field of view or located in different fields of view.

Figure 8:
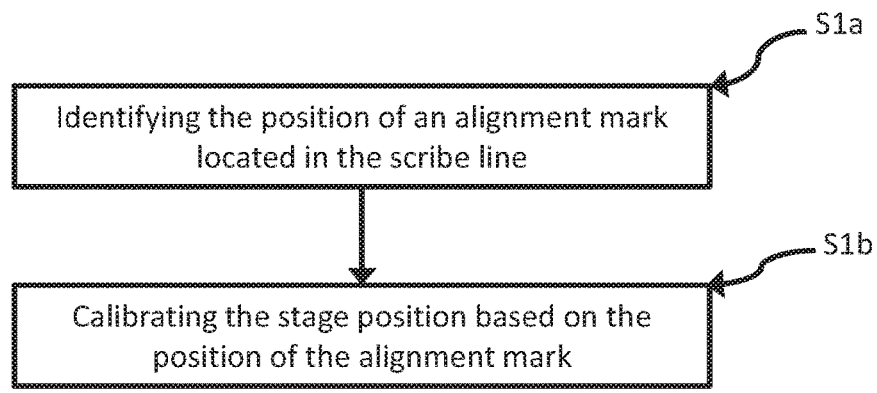
FIG. 8 illustrates the first embodiment of the die base calibration method in accordance with the present invention.

The FIG. 8 illustrates the first embodiment of the die base calibration method. First, in the step S1a, the coordinates of the alignment mark in the scribe line near the die is identified. Finally, in the step S1b, the die base position offset of the stage is calibrated according to the position of the alignment mark.

Figure 9:
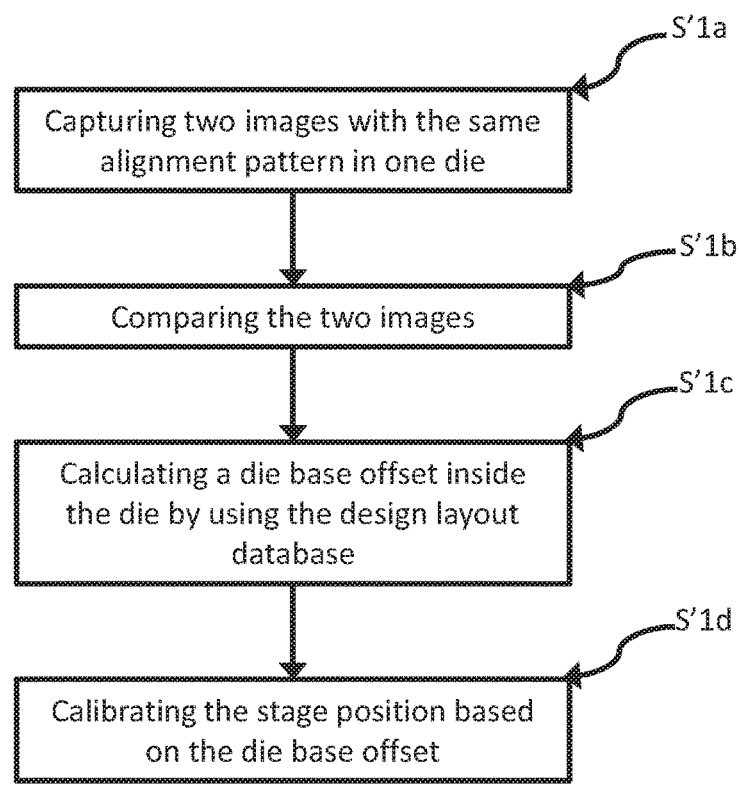
FIG. 9 illustrates the second embodiment of the die base calibration method in accordance with the present invention.

The FIG. 9 illustrates the second embodiment of the die base calibration method. First, in the step S'1a, the pattern is identified to capture two images in the die. Next, in the step S'1b, the two images are compared to obtain a result. In the step S'1c, the die base position offset of the stage is calculated according to the comparison result. Finally, in the step S'1d, the die base position offset of the stage is calibrated. More specifically, the calibration method of the FIG. 9, which is achieved by capturing two images with different positions, calculating the distance between the two images, and comparing the distance with the design layout database to acquire the die base position offset of the stage, is different from that of the FIG. 8 which is achieved by calculating the die base position offset of the stage based on the coordinates of the alignment mark. Besides, since one step of calibration method in the FIG. 9 involves the design layout database, the die base position offset of the stage is more accurate.

Figure 10:
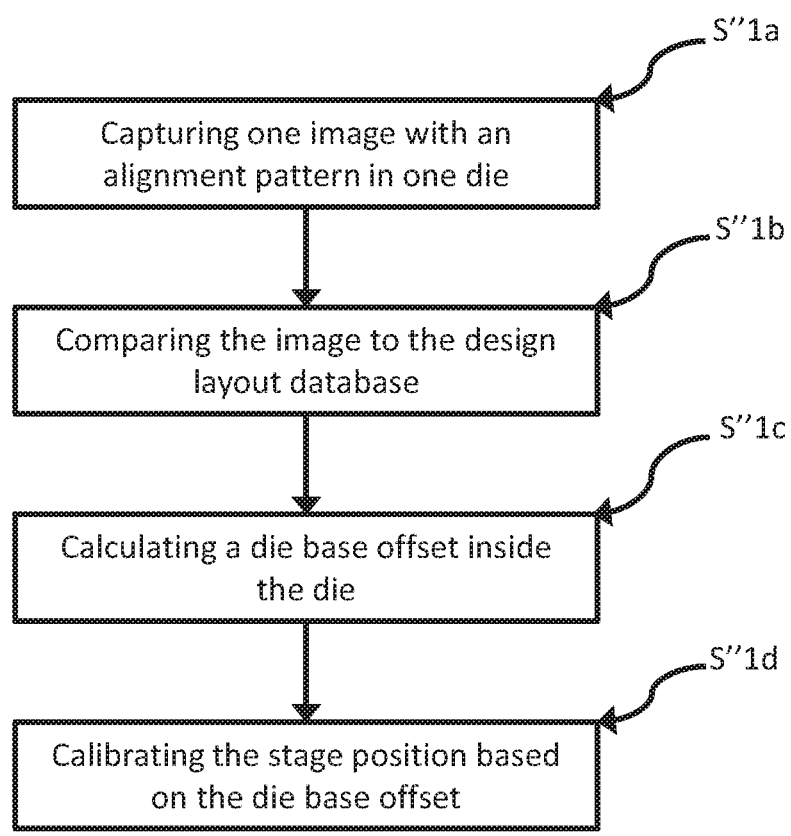
FIG. 10 shows the third embodiment of the die base calibration method in accordance with the present invention.

The FIG. 10 shows the third embodiment of the die base calibration method. First, in the step S"1a, one image in the die is obtained by identifying the pattern in the die. In the step S"1b, the position of the pattern in the image is compared with the design layout database. In the step S"1c, the die base position offset of the stage is calculated by the comparison result. Finally, in the step S"1d, the die base position offset of the stage is calibrated. Briefly, the calibration method in the FIG. 10 is to compare the pattern in the die to the design layout database and to obtain the die base position offset of the stage. The calibration method in the FIG. 9 is to compare the distance between two images to the design layout database and to obtain the die base position offset of the stage, and the calibration method in the FIG. 8 is to calculate the die base position offset of the stage according to the position of the alignment mark. Accordingly, the calibration method of the FIG. 10 is different from that of the FIG. 8 or FIG. 9, and also, the calibration method in the FIG. 10 is more accurate than that of the FIG. 8 due to the comparison by using the design layout database. On the other hand, because the calibration method in the FIG. 10 needs to capture only one image rather than capturing two images described in the FIG. 9, the calibration method in the FIG. 10 is quietly simple.

Figure 11:
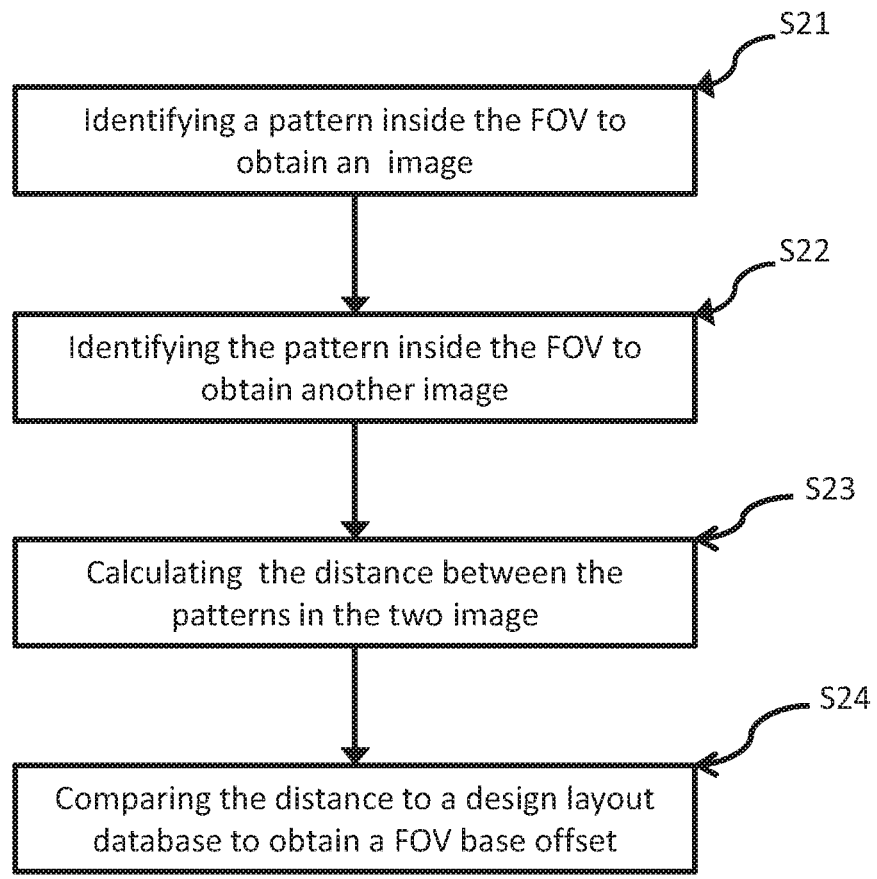
FIG. 11 shows the first embodiment of the field of view base alignment in accordance with the present invention.

Refer to FIG. 11, which shows the first embodiment of the field of view base alignment. First, in the step S21, the image is captured by identifying the pattern in the field of view. In the step S22, another image in the field of view is captured by the pattern. The step S23 is processed to calculate the distance between the two images. Finally, the step S24 is processed to compare the distance to the design layout database to obtain the field of view base position offset of the stage. The field of view base alignment can be more precise because of the small dimension of the field of view with hundreds of micrometers.

Figure 12:
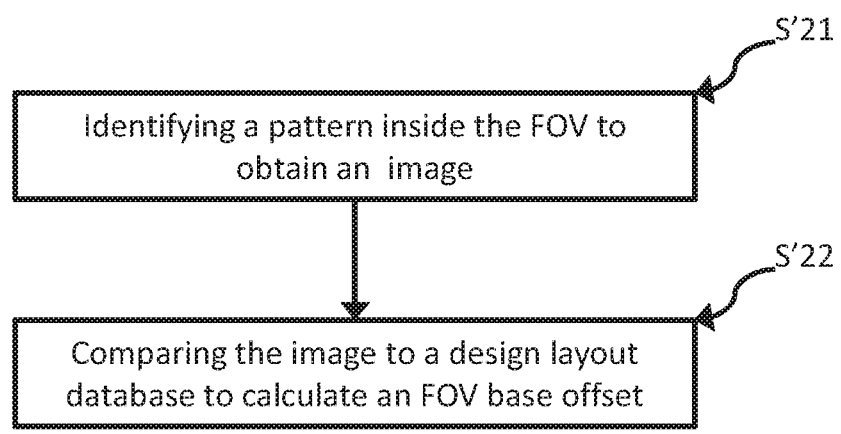
FIG. 12 illustrates the second embodiment of the field of view base alignment in accordance with the present invention.

Refer to the FIG. 12, which illustrates the second embodiment of the field of view base alignment. First, in the step S'21, the image is captured by identifying the pattern in the field of view. Finally, in the step S'22, the field of view base position offset of the stage is acquired by comparing the pattern position in the image to the design layout database. Briefly, the alignment method of the FIG. 12 is to compare the position of the image in the field of view to the design layout database, which is different from that of the FIG. 11 which calculates the distance between two images in the field of view and comparing the distance to the design layout database. Hence, the alignment method in the FIG. 11 captures two images and the alignment method in the FIG. 12 only captures one image Thus, the alignment method of the FIG. 12 is much simple than that of the FIG. 11. Also, the field of view base alignment is more precise than die base alignment due to the smaller dimension of the field of view.

Figure 13:
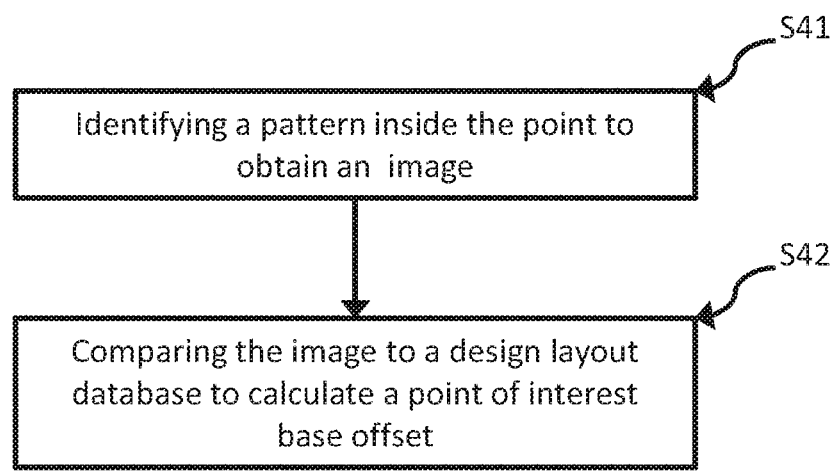
FIG. 13 shows an embodiment of the point of interest base alignment method in accordance with the present invention.

Refer to the FIG. 13, which shows the point of interest alignment method. First, in the step S41, the image in the point of interest is identified. Finally, the step S42 is to compare the pattern to the design layout database to obtain the point of interest base position offset of the stage. The point of interest is smaller than the field of view, so the point of interest base alignment is more accurate than the field of view base alignment. Besides, the deflection speed of the deflector is much faster than the speed of the stage movement, and thus the calibration time can be significantly reduced by the point of interest base alignment.

Figure 14:
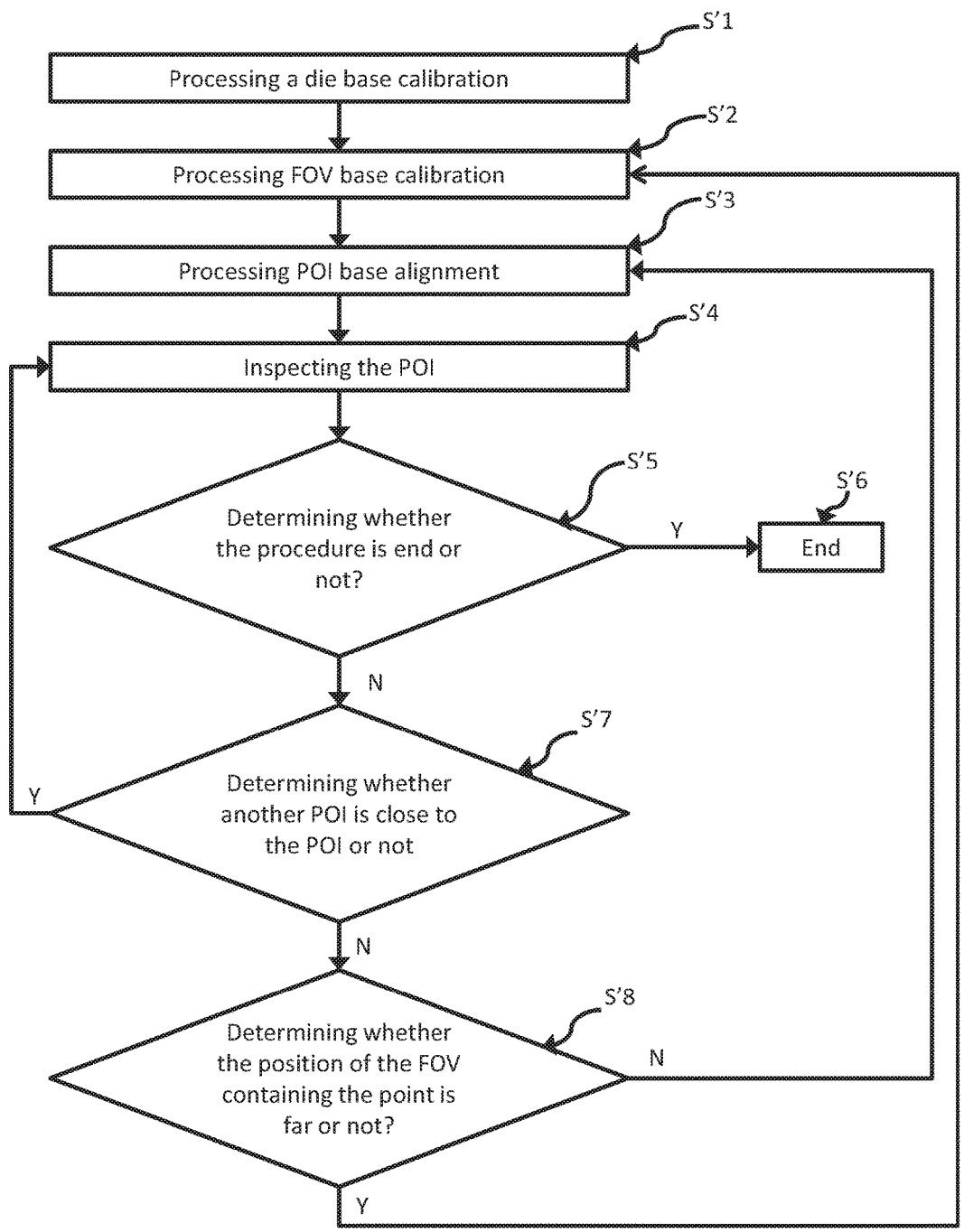
FIG. 14 illustrates another flowchart of the calibration of another embodiment of the present invention.

Next, refer to FIG. 14, illustrating another flowchart of the calibration of the present invention.

First, the step S'1, which shows the die base calibration of the stage, is processed. The die base calibration method comprises three different types. The first type of the die base calibration is to identify the position of the alignment mark located in the scribe line adjacent to the die, and to calibrate the stage position according to the position of the alignment mark. The second die base calibration method is to calculate the distance between two images in the die, to compare the distance to the design layout database to acquire the die base position offset of the stage, and to calibrate the stage error according to the die base position offset of the stage. The third die base calibration method is to compare the position of the pattern in the image to the design layout database to obtain the die base position offset of the stage, and to calibrate the stage error according to the die base position offset of the stage.

In the step S'2, illustrating the field of view base calibration for calibrating the field of view base offset of the stage. The field of view base calibration includes the field of view base alignment and correction. The field of view alignment method can be divided into two types. One type of the field of view base alignment sequentially comprises the steps of identifying the pattern in the field of view, capturing the image by the pattern, capturing another image by the same pattern, calculating the distance between the two patterns in the two images, and comparing the distance to the design layout database to obtain the field of view base position offset of the stage. The other type of the field of view base alignment method is to identify the position of the pattern inside the field of view, to compare the position coordinate of the pattern to the design layout database, and to obtain the field of view base position offset of the stage. Since dimension of the field of view is much smaller than that of the die, which is only hundreds micrometers, the field of view calibration can be more precise.

Next, the step S'3 illustrates the point of interest base alignment. The point of interest alignment is to compare the pattern position in the image obtained in the point of interest to the design layout database to obtain the point of interest base position offset of the stage. The dimension of the point of interest is tinier than that of the field of view, and therefore the accuracy of the point of interest base alignment is enhanced rather than the field of view base alignment or the die base alignment. Then, the step S'4 which shows the step of inspecting the point of interest is processed.

After inspecting the point of interest, the step S'5 is processed. The step S'5 is to determine whether the flow is finished or not. If the flow is finished, then the calibration procedure is finished which the step S'6 shows. On the other hand, if the flow is not finished, then the step S'7 is processed, which means that another point of interest is determined whether the distance between it and the point of interest is smaller than the first threshold or not. When the distance between that another point of interest and the previous point of interest is smaller than the first threshold value, then the step S'4 is processed again. In this way, the calibration time of the deflector and the stage movement can be saved, and thus the throughput can be highly increased. If that another point of interest is not close to the point of interest, the step S'8 is processed. The step S'8 is to determine whether the distance between the field of view having that another point of interest and the first field of view is larger than the second threshold or not. If the distance between the field of view having that another point of interest and the first field of view is larger than the second threshold, the step S'2 should be processed again, which means the field of view base calibration is processed again. On the contrary, if the distance between the field of view having that another point of interest and the first field of view is smaller than the second threshold value, the step S'3 is processed again, which means the point of interest base alignment is processed again.

Figure 15:
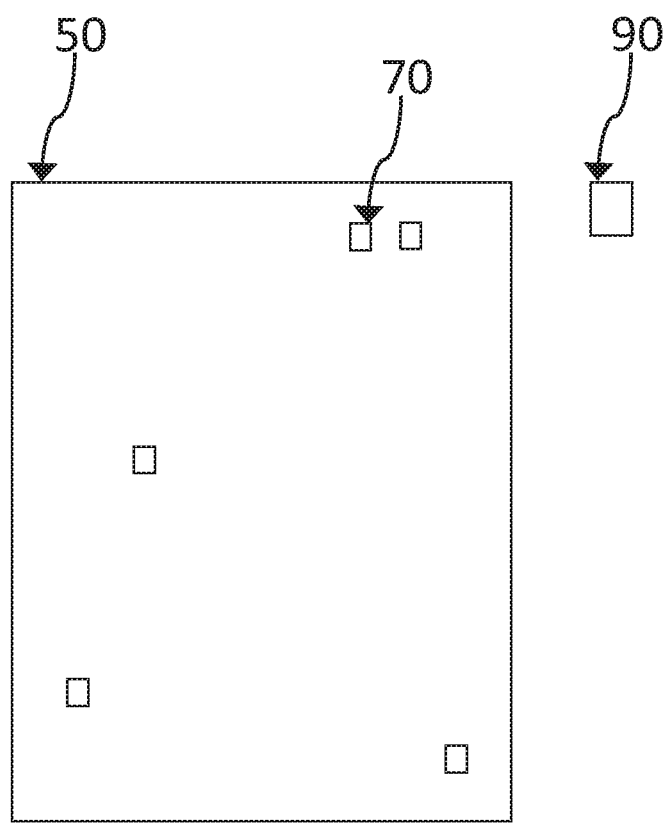
FIG. 15 shows the diagram of the field of view in the ebeam inspection tool and in the CD SEM or review SEM.

Finally, refer to the FIG. 15, which reveals the diagram of the field of view in the ebeam inspection tool and in the CD SEM/Review SEM. According to the FIG. 15, the beam current of the ebeam inspection tool is thousand times larger than that of the CD SEM or the Review SEM, and the field of view 50 of the ebeam inspection tool is hundreds times wider than the field of view 90 of the CD SEM or the Review SEM also. The CD SEM is applied to measure the critical dimension of the target dice, and the review SEM is used to review the suspected dice. However, the ebeam inspection tool is used to inspect all the dice in the wafer, which has different functions from the CD SEM and the review SEM. Therefore, the error of the stage position can be suffered in the CD SEM or the review SEM, but can't in the ebeam inspection tool. By using the calibration method of the present invention, the error incurred by the stage movement is corrected precisely, the complex and repeated alignment and calibration procedures in the prior art are significantly reduced, and the throughput is increased.

Furthermore, processing the vector scan by using the point of interest base calibration is much useful. More specifically, the vector scan is to scan a patch image in the point of interest rather than scan the full field of view. The vector scan is achieved by controlling the deflection direction and/or angle of the deflector. Besides, if the two points of interest are close, the stage does not need to be moved so as to increase the inspection throughput.

By using the point of interest base and the field of view base alignment, the position error induced by the stage can be offset more precisely due to the tiny dimension of the point of interest and the field of view. Besides, if the points of interest are close or the field of view is within the care area, the repeated point of interest base alignment procedures or the repeated field of view base alignment procedures can be neglected, and thus the alignment duration is reduced, and the throughput is accordingly enhanced.

Although the present invention has been explained in relation to its preferred embodiment, it is to be understood that other modifications and variation can be made without departing the spirit and scope of the invention as hereafter claimed.

What is claimed is:

1. An alignment method within a first point of interest in a field of view, comprising:
   identifying a pattern inside the first point of interest scanned by a charged particle beam tool;
   comparing a location of the pattern in the first point of interest to a design layout database corresponding to the pattern;
   determining an offset induced from the charged particle beam tool; and
   calibrating an imaging position of the first point of interest based on the offset.

2. The alignment method according to claim 1, wherein the offset is applied to a deflector of the charged particle beam tool.

3. The alignment method according to claim 2, wherein the offset is applied to a second point of interest located within a first threshold distance away from the first point of interest.

4. The alignment method according to claim 2, further comprising:
   determining whether a distance between a third point of interest and the first point of interest is larger than the first threshold distance; and
   in response to determining the distance is larger than the first threshold distance, determining another offset.

5. The alignment method according to claim 2, wherein the charged particle beam tool is a swing objective retarding immersion lens (SORIL) ebeam inspection tool.

6. The alignment method according to claim 5, wherein the design layout database is a graphic database system (GDS) or an open artwork system interchange standard (OASIS).

7. A method for calibrating a stage moving error in die inspection by using a charged particle beam tool, comprising:
   aligning a first field of view scanned by the charged particle beam tool to a design layout database prior to a first point of interest in the first field of view being inspected, such that a first field of view base position error of the charged particle beam tool is obtained;
   aligning the first point of interest in the first field of view scanned by the charged particle beam tool to the design layout database prior to the first point of interest being inspected, such that a first point of interest base position error of the charged particle tool is obtained;
   determining whether a distance between a second point of interest scanned by the charged particle beam tool and the first point of interest is larger than a threshold; and
   in response to determining the distance is larger than the threshold, aligning the second point of interest to the design layout database prior to the second point of interest being inspected, such that a second point of interest base position error of the charged particle beam tool is obtained.

8. The method according to claim 7, wherein the first point of interest base position error and the second point of interest base position error of the charged particle beam tool is offset by controlling a deflector.

9. The method according to claim 8, further comprising:
   determining whether a second distance between a second field of view including the second point of interest and the first field of view is larger than a second threshold; and
   in response to determining the second distance is larger than the second threshold, aligning the second field of view to the design layout database prior to the second point of interest being inspected.

10. The method according to claim 8, wherein the first point of interest aligning comprises comparing a pattern in the first point of interest to the design layout database and determining the first point of interest base position error.

11. The method according to claim 8, further comprising:
    processing a die base calibration procedure to the die prior to the first field of view base alignment procedure.

12. The method according to claim 8, wherein the first point of interest base position error and the second point of interest base position error are induced from the stage moving error.

13. The method according to claim 8, wherein the charged particle beam tool is a SORIL ebeam tool.

14. The method according to claim 13, wherein the design layout database is GDS or OASIS.

15. A method for calibrating a stage movement error when a wafer is inspected by using a charged particle beam tool, comprising:
    processing a die base calibration procedure to a specific die on the wafer, such that a die base error is offset;
    processing a first field of view base alignment procedure to a first field of view on the specific die, such that a first field of view base error is determined and applied to a stage of the charged particle beam tool;
    processing a first point of interest base alignment procedure to a first point of interest in the first field of view, such that a first point of interest base error is determined and applied to a deflector of the charged particle beam tool;
    inspecting the first point of interest;
    inspecting a second point of interest less than or equal to a first threshold distance away from the first point of interest with the first point of interest base error applied to the deflector of the charged particle beam tool;
    determining whether a distance between a third point of interest and the first point of interest is larger than a threshold;
    in response to determining the distance is larger than the threshold, processing a second point of interest base alignment procedure to the third point of interest, such that a second point of interest base error is determined and applied to the deflector of the charged particle beam tool;
    inspecting the third point of interest;
    determining whether a second distance between a second field of view on the specific die and the first field of view is larger than a second threshold; and
    in response to determining the second distance is larger than the second threshold, processing a second field of view base alignment procedure to the second field of view, such that a second field of view base error is determined and applied to the stage of the charged particle beam tool.

16. The method according to claim 15, wherein processing the first point of interest base alignment procedure comprises:
    identifying a first point of interest alignment pattern within the first point of interest; and determining the first point of interest base error by comparing the first point of interest to the design layout database.

17. The method according to claim 15, wherein processing the second point of interest base alignment procedure comprises:
  identifying a second point of interest alignment pattern within the third point of interest; and
  determining the second point of interest base error by comparing the third point of interest to the design layout database.

18. The method according to claim 16, wherein processing the first field of view base alignment procedure comprises:
  identifying a first field of view base alignment pattern within the first field of view in a first image; and
  comparing the first image to a design layout database corresponding to the first field of view base alignment pattern to determine the first field of view base offset.

19. The method according to claim 16, wherein processing the first field of view alignment procedure comprises:
  identifying a first field of view base alignment pattern within the first field of view in a first image;
  identifying the first field of view base alignment pattern within the second field of view in a second image; and
  comparing the first field of view base alignment pattern in the first field of view and the second field of view to obtain the first field of view base error.

20. The method according to claim 16, wherein processing the die base calibration procedure comprises:
  scanning a first image with a die base alignment pattern;
  scanning a second image different from the first image with the die base alignment pattern;
  determining a die base offset by comparing the die base alignment pattern in the first image and the die base alignment pattern in the second image;
  comparing the die base offset to the design layout database to obtain the die base error; and
  calibrating the stage movement error based on the die base error.

21. The method according to claim 16, wherein processing the die base calibration procedure comprises:
  scanning an image with a die base alignment pattern;
  determining the die base error by comparing the image to a design layout database relative to the die base alignment pattern; and
  calibrating the stage movement error based on the die base error.

22. The method according to claim 16, wherein the second point of interest is within the second field of view.

23. The method according to claim 16, wherein the second point of interest is within the first field of view.

24. The method according to claim 16, wherein the charged particle beam tool is a SORE ebeam tool.

* * * * *

UNITED STATES PATENT AND TRADEMARK OFFICE
CERTIFICATE OF CORRECTION

PATENT NO.           : 9,953,803 B2
APPLICATION NO.      : 15/049524
DATED                : April 24, 2018
INVENTOR(S)          : Wei Fang et al.

Page 1 of 1

It is certified that error appears in the above-identified patent and that said Letters Patent is hereby corrected as shown below:

Claim 24, Column 18, Line 26, "tool is a SORE ebeam tool." should read -- tool is a SORIL ebeam tool. --.

Signed and Sealed this
Twenty-fifth Day of September, 2018

Andrei Iancu
*Director of the United States Patent and Trademark Office*